(12) United States Patent
Jinushi

(10) Patent No.: US 6,510,399 B1
(45) Date of Patent: Jan. 21, 2003

(54) METHOD OF DRIVING A METER

(75) Inventor: Kouichi Jinushi, Nagaoka (JP)

(73) Assignee: Nippon Seiki Co., Ltd., Niigata (JP)

( * ) Notice: Subject to any disclaimer, the term of this patent is extended or adjusted under 35 U.S.C. 154(b) by 0 days.

(21) Appl. No.: 09/554,890

(22) PCT Filed: Sep. 20, 1999

(86) PCT No.: PCT/JP99/05154
§ 371 (c)(1),
(2), (4) Date: May 22, 2000

(87) PCT Pub. No.: WO00/19216
PCT Pub. Date: Apr. 6, 2000

(30) Foreign Application Priority Data

Sep. 30, 1998 (JP) ............................. 10-276299

(51) Int. Cl.$^7$ ................................................ G01D 1/00
(52) U.S. Cl. ........................................ 702/127; 702/151
(58) Field of Search ........................ 318/696; 324/146; 364/151

(56) References Cited

U.S. PATENT DOCUMENTS

| | | | |
|---|---|---|---|
| 5,497,078 A | * | 3/1996 | Queen et al. ............... 324/146 |
| 5,519,605 A | * | 5/1996 | Cawlfield .................. 364/151 |
| 5,723,964 A | | 3/1998 | Nakaba |
| 6,034,501 A | * | 3/2000 | Sato ........................... 318/696 |

FOREIGN PATENT DOCUMENTS

| | | |
|---|---|---|
| EP | 0465334 A | 1/1992 |
| EP | 0 588 582 A | 3/1994 |
| EP | 833131 | 4/1998 |
| EP | 863382 | 9/1998 |
| JP | 61-129575 | 6/1986 |
| JP | 1-223312 | 9/1989 |

* cited by examiner

Primary Examiner—John S. Hilten
Assistant Examiner—Douglas N Washburn
(74) Attorney, Agent, or Firm—McDermott, Will & Emery

(57) ABSTRACT

A method including acting a pointer toward a first target value B of the pointer from an indicated value A1 of the pointer determined at the present time, comparing the first target value B and a second target value C, judging whether the second target value C is increased or decreased relative to first target value B, using a predetermined function to obtain an indicating characteristic which indicates a value equal to or more than first target value B from the indicated value A1 of the pointer where the second target value is increased, and an indicating characteristic indicating a value equal to or less than first target value B from indicated value A1 of the pointer where the second target value is decreased, and smoothly acting the pointer using an indicated value p in unit of output updating cycle in accordance with the indicating characteristics.

2 Claims, 3 Drawing Sheets

METHOD OF DRIVING A METER

TECHNICAL FIELD

The invention relates to a method of driving a meter, the method comprising acting a pointer mounted on a drive unit by mounting the pointer on the drive unit composed of a stepping motor, a rotary magnet type ampere meter of the cross coil type, inputting in a predetermined cycle an amount of measurement from an object being measured, and outputting to the drive unit a change in the amount of measurement as an indicated value in predetermined unit of output updating cycle.

BACKGROUND OF THE INVENTION

Conventional analog type indicating meters employ a stepping motor, a rotary magnet type ampere meter of the cross coil type, and so on. For example, a drive device for meters, having a drive unit composed of a stepping motor comprises a drive circuit for driving the stepping motor on the basis of a digital signal conformed to an amount of measurement, and a pointer mounted on a drive shaft end of the stepping motor to indicate graduation on a dial plate, which corresponds to the amount of measurement, thereby representing the amount of measurement.

Such drive device for meters can be used in, for example, a running speedometer and an engine speedometer for automobiles, and further in a fuel meter and a thermometer with an A/D processing of a detected signal, and various proposals for such drive device having been presented for commercial application, such as disclosed in Japanese Patent Laid-Open Nos. 129575/1986, and 223312/1988. Recently, serial communication has prevailed in meters for vehicles, and drive devices have been developed, which drive respective meter bodies by transferring to respective meters through a serial transmission cable from an ECU (Engine Control Unit) loaded on a vehicle a digital signal conformed to a running condition of the vehicle. When respective meters are to be driven through such serial communication control, there is involved a problem that even gentle changes in amounts of measurement become rapid changes on sides of the indicating meters to provide no smooth indicating action on the indicating meters since an output updating cycle presents itself in unit of 50 msec when a cycle (input cycle) of amounts of measurement inputted into a processing unit (processing circuit) for acting the indicating meters is 50 msec even if an output updating cycle of a processing circuit itself for driving a drive unit composed of a stepping motor has a capability of 5 msec in a speedometer and a tachometer for indicating a speed of car and an engine revolution, of which amount of measurements change much.

In particular, with stepping motors, correction of drive signal waveform provides smoothness on the basis of a stepping motion, which corresponds to a pitch of teeth on a comb-shaped yoke.

Such stepping motors involve a problem that a change in a drive signal to a stepping motor becomes great when an updating cycle of measurement data is great relative to a change in an amount of measurement, and the stepping motor itself is excellent in responsiveness, whereby when a change in data in a period of output updating is great conversely, such great change is ascertained to immediately give rise to an intermittent motion on a pointer, thus not obtaining any smooth indicating action in indicating meters.

Hereupon, the invention takes notice of the above-mentioned problem, and provides a method of driving a meter, in which an intermittent motion on a pointer is prevented and a smooth indicating motion is obtained in an indicating meter.

DISCLOSURE OF THE INVENTION

The invention relates to a method of driving a meter by inputting into a processing unit in a predetermined cycle an amount of measurement from an object being measured, and outputting to a drive unit a change in the amount of measurement as an indicated value in predetermined unit of output updating cycle of the processing unit to act a pointer mounted on the drive unit.

The invention provides a method of driving a meter comprising using a predetermined function to obtain an indicating characteristic, which determines a behavior of the pointer, on the basis of an indicated value of the pointer in the past, an indicated value of the pointer determined at the present time, and a target value, which acts the pointer in response to the amount of measurement, to thereby act the pointer with the indicated value along the indicating characteristic in the unit of output updating cycle.

A first driving method comprises sequentially inputting into the processing unit first and second target values to act the pointer in accordance with the amount of measurement, comparing the first target value and the second target value with each other when acting the pointer toward the first target value from an indicated value of the pointer determined at the present time, judging whether the second target value tends to be increased or decreased relative to the first target value, using a predetermined function to obtain an indicating characteristics, which indicates a value equal to or more than the first target value from the indicated value of the pointer determined at the present time, in the case where the second target value tends to be increased, and an indicating characteristics, which indicates a value equal to or less than the first target value from the indicated value of the pointer determined at the present time, in the case where the second target value tends to be decreased, and acting the pointer by means of an indicated value in the unit of output updating cycle in accordance with the indicating characteristics,-so that the pointer can be smoothly acted as compared with the case where the pointer is acted by the indicated value in unit of output updating cycle in accordance with the indicating characteristics, which is obtained by simply linearly connecting indicated values obtained in at a predetermined input cycle.

Also, a second driving method comprises inputting a target value to act the pointer in accordance with the amount of measurement, using a predetermined function to obtain an indicating characteristics, which indicates a first indicated value when acting the pointer toward the target value from the first indicated value of the pointer determined at the present time, and which approximates a second indicated value, which becomes a target value of the pointer in the past, and the target value, and acting the pointer by means of an indicated value in the unit of output updating cycle in accordance with the indicating characteristics, so that the pointer can be smoothly acted as compared with the case where the pointer is acted by the indicated value in unit of output updating cycle in accordance with the indicating characteristics, which is obtained by simply linearly connecting indicated values obtained at a predetermined input cycle.

BEST MODE FOR CARRYING OUT THE INVENTION

Figure 1:
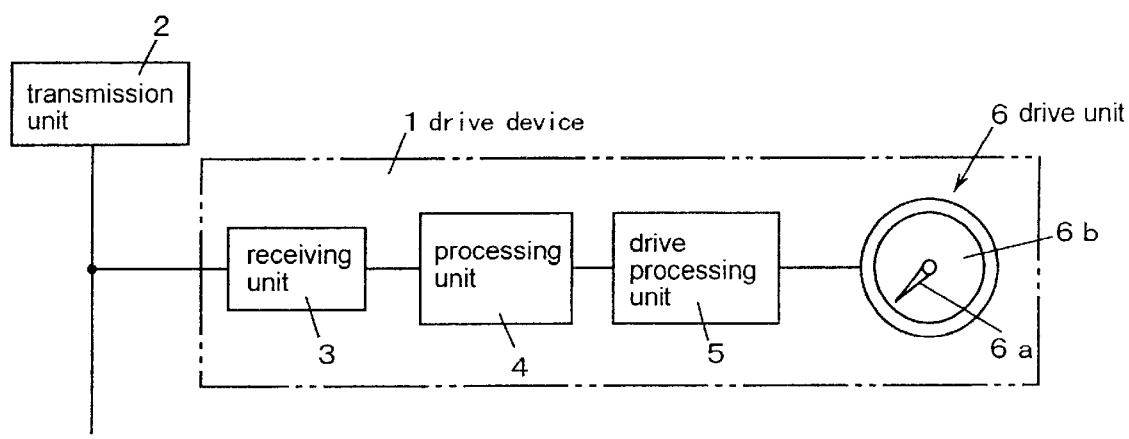
FIG. 1 is a block diagram showing a drive device in a meter according to the invention.

In FIG. 1, there is shown a drive device 1 for controlling a drive unit on the basis of data (measurement) transferred by serial communication. The reference numeral 2 designates a transmission unit for counting a pulse signal, such as vehicle speed, engine rotating speed, etc., every period of time determined by a reference clock, using a multiplex communication interface unit (not shown) to perform parallel/serial conversion of the measurement into a data signal, and transmitting the data signal to a receiving unit described later at a predetermined cycle. The reference numeral 3 designates a receiving unit, which uses a multiplex communication interface unit (not shown) to perform parallel/serial conversion of a data signal corresponding to an amount of measurement transferred from the transmission unit 2. The reference numeral 4 designates a primary unit being a processing unit for converting a data signal obtained by the receiving unit 3, into an indicated value conformed to the amount of measurement, and comprising a microcomputer. The reference numeral 5 designates a drive output unit for using the indicated value obtained by the processing unit 4 to drive a stepping motor, which defines a drive unit described later, through voltage conversion. The reference numeral 6 designates a drive unit of the stepping motor type indicating an amount of measurement of an object being measured, by using a pointer 6a mounted on an end of a drive shaft of the stepping motor to indicate graduation on a dial plate 6b. The drive device 1 is composed of the receiving unit 3, the processing unit 4, the drive output unit 5, and the drive unit 6. Also, the drive device 1 and the transmission unit 2 are connected to each other by a transmission line 7 composed of a serial transfer cable.

Figure 2:
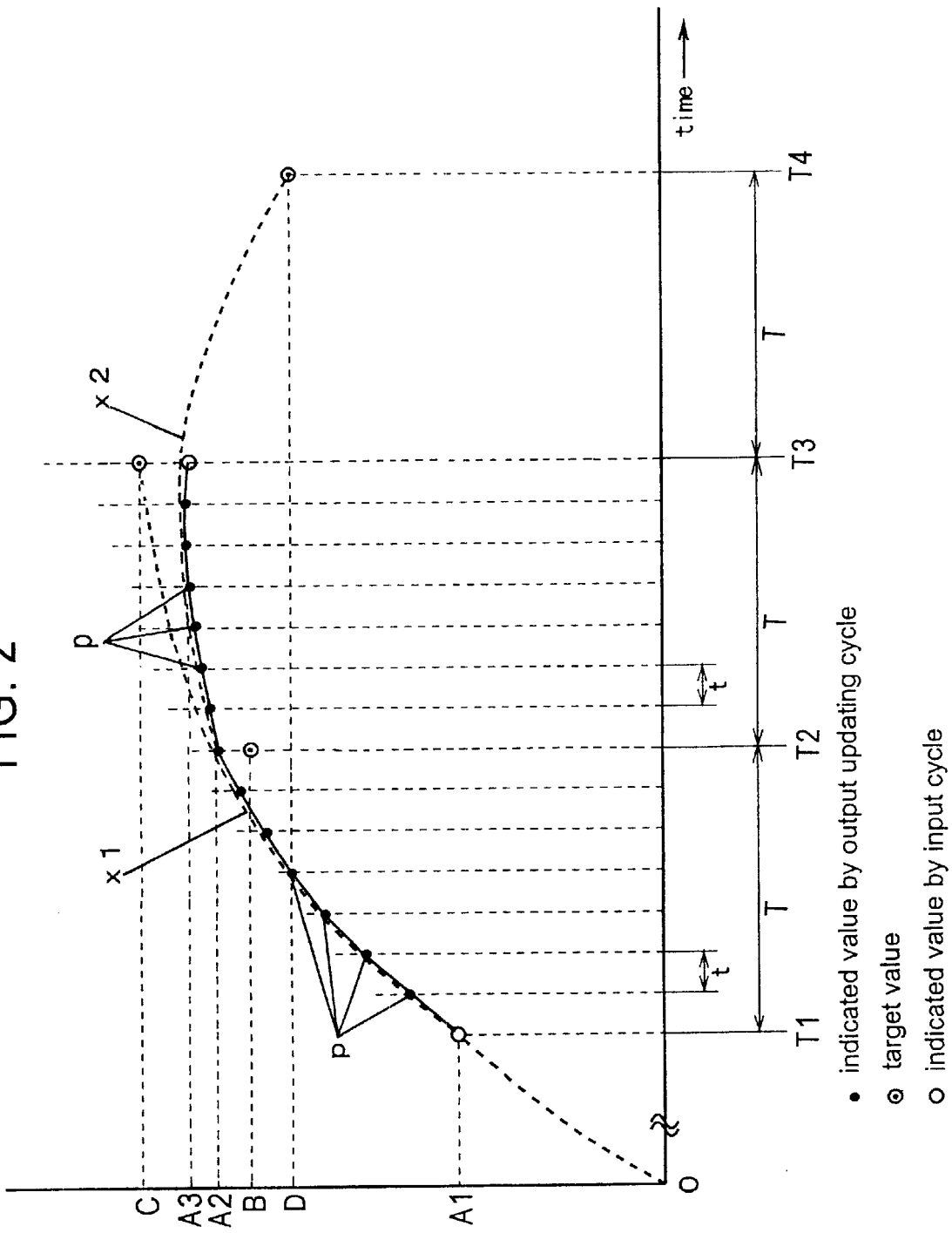
FIG. 2 is a view showing a first processing procedure in a processing unit according to the invention.

A first processing method in the processing unit 4 will be explained with reference to FIG. 2.

When sequentially receiving a first target value B conformed to an amount of measurement, which is to be indicated next by the pointer 6a, and a second target value C conformed to an amount of measurement, which is to be indicated further next by the pointer 6a, in a predetermined cycle T, the processing unit 4 compares with each other and processes the first target value B and the second target value C to judge whether the second target value C having been input in the predetermined cycle T tends to be increased or decreased to the first target value B from an indicated value A1 of the pointer 6a determined at the present time (indicated since the present time).

Subsequently, when judging that the second target value tends to be increased, the processing unit 4 uses a function formula described later to determine an indicating characteristic x1 between the indicated value A1 and the second target value C (between a time T1 and a time T3) in order to determine a behavior of the pointer 6a, which acts the pointer 6a toward the second target value C from the indicated value A1 via the first target value B. In this case, the processing unit 4 sets the indicating characteristic x1 such that an indicated value A2, which is to be indicated at a time T2, at which the first target value B is input, makes an indicated value equal to or more than the first target value B (an indicated value above the first target value B in FIG. 2).

Subsequently, the processing unit 4 outputs an indicated value p in unit of output updating cycle t in a manner to make the value along the indicating characteristic x1 in an interval between the indicated value A1 and the first target value B (between the time T1 and the time T2), thus acting the pointer 6a of the drive unit 6.

Accordingly, the processing unit 4 will issue an instruction along the indicating characteristic x1 between the indicated value A1 (the time T1) and the first target value B (the time T2) by outputting the indicated value p in unit of output updating cycle t until a time T4, at which a next third target value D is input.

Subsequently, the processing unit 4 compares with each other and processes a target value C (first target value) at a time T3 and a target value D (second target value) at a time T4 to judge whether the target value D tends to be increased or decreased to the target value C from an indicated value A2 (determined at the present time), and when judging that the target value tends to be decreased, uses a function formula described later to determine an indicating characteristic x2 between an indicated value A2 and the target value D (between the time T2 and the time T4) in order to determine a behavior of the pointer 6a, which acts the pointer 6a toward the target value D from the indicated value A2. As described above, the processing unit 4 sets the indicating characteristic x2 such that an indicated value A3, which is to be indicated at a time T3, becomes equal to or less than the first target value B, and issues an instruction along the indicating characteristic x between the indicated value A2 (the time T2) and the target value C (the time T3) by outputting the indicated value p in unit of output updating cycle t until a next target value is input.

The processing unit 4 can obtain a smooth indicating action along the indicating characteristic by repeating the procedure described above.

The indicating characteristic described above is determined by the following function formula.

For example, in the case where an indicating characteristic is calculated by using a SIN function as a predetermined function, a function $f_n$ for instructively acting the pointer 6a between $T_n$ and $T_{n+1}$ is defined in the following manner where $X_n$ designates a target value, which should be indicated in input cycle $T_n$ (T1, T2, T3, - - - ), and $Y_n$ designates an indicated value calculated in $T_n$.

$$f_n(ta) = k1 \cdot \text{SIN}(\pi \cdot (ta - T_n)/(T_{n+1} - T_n)) +$$
$$k2 \cdot ((ta - T_n)/(T_{n+1} - T_n)) + Y_n (T_n \leq ta \leq T_{n+1})$$

where $k1 = a \cdot (X_{n+1} - X_{n+2})$, $k2 = b \cdot (X_{n+1} - Y_n)$ are used as an index for numeric conversion of a state of instructing action change (a value indexing tendencies of increase and decrease), and a, b represent constants set in accordance with specifications such as responsiveness as required, smoothness in action, and cycles of input and output, etc.,.

Also, ta designates an instruction time of the indicated value p in output updating cycle t.

Figure 3:
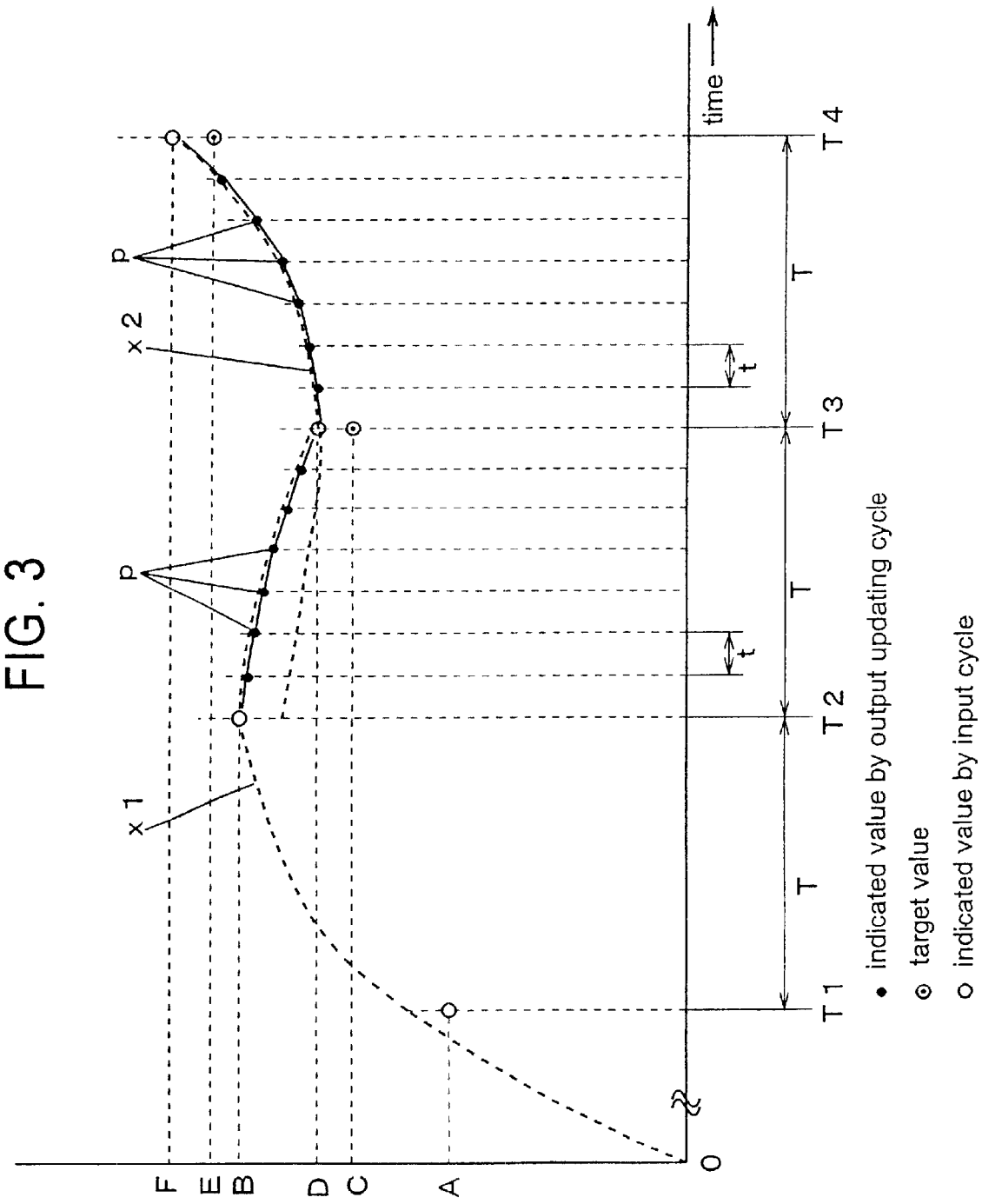
FIG. 3 is a view showing a second processing procedure in the processing unit according to the invention.

Next, a second processing method in the processing unit 4 will be explained with reference to FIG. 3.

When receiving a first target value C conformed to an amount of measurement in the predetermined cycle T, the processing unit 4 indicates a target value B from an indicated value A (second indicated value) in the past, having been indicated by the pointer 6a, a target value B (first target value) determined at present time (indicated later), and a first target value C, and uses a function formula described later to determine an indicating characteristics, which approximates the indicated value A and the first target value C. That is, the processing unit 4 gets the indicating characteristic x1 between the indicated value A and the first target value C (between a time T1 and a time T3) to determine an indicated value D, which is to be indicated at a time T3 (a time, at which the first target value C is input) in order to determine a behavior of the pointer 6a, in which the pointer 6a is made to act toward the first target value C from the indicated value B, and outputs an indicated value p along the indicating characteristic x1 in unit of output updating cycle t between the second indicated value B and the indicated value D (between the time T2 and the time T3). The processing unit 4 outputs the indicated value p until a next second target value E conformed to an amount of measurement is input.

When receiving the second target value E, the processing unit 4 determines an indicated value D, as in the procedure described above, from the indicated value B (will be an indicated value in the past), the indicated value D, which will be indicated later, and a second target value E to determine an indicating characteristic x2, which approximates the indicated value B and the target value E to determine an indicated value F, which is to be indicated at a time T4 (a time, at which the second target value E is input), and outputs an indicated value p along the indicating characteristic x2 in unit of output updating cycle t between the indicated value D and the indicated value F (between the time T3 and the time T4).

The processing unit 4 can obtain a smooth indicating action along the indicating characteristics by repeating the procedure described above.

The indicating characteristics described above are determined by the following function formula.

For example, in the case where an indicating characteristic is calculated by using a quadratic function as a predetermined function, a function $f_n$ for instructively acting between input cycles $T_n$ (T1, T2, T3, - - - ) and $T_{n+1}$ can be represented in the following manner when the function $f_n$ is defined in a manner to pass $(T_n, Y_n)$, $X_n$ designates a target value, which should be indicated in input cycle $T_n$ and $Y_n$ designates an indicated value calculated in $T_n$.

$$f_n(ta) = A_n \cdot ((ta - T_n)/(T_{n+1} - T_n))^2 + B_n \cdot ((ta - T_n)/(T_{n+1} - T_n)) + Y_n (T_n \leq ta \leq T_{n+1})$$

where $A_n$ and $B_n$ are attributes found by a predetermined approximate calculation.

Also, ta designates an indicated time for the indicated value p in unit of output updating cycle t.

In the case of assuming that the indicated value in the past is $(T_{n-1}, Y_{n-1})$ and a target value is $(T_{n+1}, X_{n+1})$, the indicating characteristic x determines the attributes $A_n$, $B_n$ with the method of least squares so that they pass in the vicinity of the above indicated value and the above target value.

The respective processing methods described above use the predetermined function to get that indicating characteristics, which determines the behavior of the pointer 6a, on the basis of an indicated value of the pointer 6a in the past, an indicated value of the pointer 6a determined at the present time, and a target value, which acts the pointer 6a in response to an amount of measurement, to thereby act the pointer 6a smoothly with the indicated value p along the above-mentioned indicating characteristics in unit of output updating cycle t.

The first processing method sequentially inputs into the processing unit 4 first and second target values conformed to amounts of measurement in order to smoothly act the pointer 6a mounted on the drive unit 6 of stepping motor type. And the processing unit 4 comprises comparing the first target value and the second target value with each other, to judge whether the second target value tends to be increased or decreased relative to the first target value, using a function, by which a curve, for example, of the SIN function is obtained, to obtain the indicating characteristic x1, which indicates a value equal to or more than the first target value from the indicated value of the pointer 6a determined at the present time, in the case where the second target value tends to be increased, and the indicating characteristic x2, which indicates a value equal to or less than the first target value from the indicated value of the pointer 6a determined at the present time, in the case where the second target value tends to be decreased, and outputting the indicated value p along such indicating characteristics in unit of output updating cycle t of the processing unit 4 to enable smoothly acting the pointer 6a as compared with the case where the pointer is acted by the indicated value in unit of output updating cycle in accordance with the indicating characteristics, which is obtained by simply linearly connecting indicated values obtained at a predetermined input cycle.

Also, the second processing method comprises inputting the target value conformed to an amount of measurement in order to smoothly act the pointer 6a mounted on the drive unit 6 of stepping motor type, indicating the first indicated value when the pointer is acted toward the target values from the first indicated value of the pointer 6a determined at the present time, using a function, by which a curve, for example, of a quadratic function is obtained, to obtain the indicating characteristics x1,x2, which approximate the second indicated value in the past and the target value, and outputting an indicated value p along the indicating characteristics x1, x2 in unit of output updating cycle t of the processing unit 4 to enable smoothly acting the pointer 6a as compared with the case where the pointer is acted by the indicated value in unit of output updating cycle in accordance with the indicating characteristics, which is obtained by simply linearly connecting indicated values obtained at a predetermined input cycle.

In addition, the first and second processing methods carry out the respective procedures described above after receiving an amount of measurement in a predetermined cycle from an object being measured, so that they involve some delay until the amount of measurement is indicated in the drive unit 6 since input of the amount of measurement. However, such delay is relative as an action of the drive unit 6 and so entails no sense of incongruity.

Also, while the indicating characteristics are found by using a SIN function in the first processing method and using a quadratic function in the second processing method, a SIN function, a quadratic function, a tertiary function, and so on may be employed.

Also, it goes without saying that with the processing methods described above, in the case where an indicating characteristic is to be obtained in a zone between the indicated value of the pointer 6a determined at the present time, and a target value, an indicating characteristic indicating a target value conformed to an amount of measurement as it is can be obtained depending upon a change in the next target value.

Also, while an explanation has been made exemplifying the drive device 1, which acts on serial communication, the invention may be applied to a drive device for meters adapted to receive an amount of measurement directly from an object being measured.

INDUSTRIAL APPLICABILITY

The invention is not limited to an apparatus provided with a drive unit of the stepping motor type, which is excellent in follow-up performance of a pointer, but provides favorable driving of a meter with a drive unit of the cross coil type.

What is claimed is:

1. A method of driving a meter by inputting into a processing unit in a predetermined cycle an amount of measurement from an object being measured, and outputting to a drive unit a change in the amount of measurement as an indicated value in a predetermined unit of an output updating cycle of the processing unit to act a pointer mounted on the drive unit, the method comprising using a predetermined function to obtain an indicating characteristic, which determines a behavior of the pointer, on the basis of an indicated value of the pointer in the past, an indicated value of the pointer determined at the present time, and a target value, which acts the pointer in response to the amount of measurement, to thereby act the pointer with the indicated value along the indicating characteristic in the unit of an output updating cycle.

2. A method of driving a meter by inputting into a processing unit in a predetermined cycle an amount of measurement from an object being measured, and outputting to a drive unit a change in the amount of measurement as an indicated value in a predetermined unit of an output updating cycle of the processing unit to act a pointer mounted on the drive unit, the method comprising sequentially inputting into the processing unit first and second target values to act the pointer in accordance with the amount of measurement, comparing the first target value and the second target value with each other when acting the pointer toward the first target value from an indicated value of the pointer determined at the present time, judging whether the second target value tends to be increased or decreased relative to the first target value, using a predetermined function to obtain an indicating characteristic, which indicates a value equal to or more than the first target value from the indicated value of the pointer determined at the present time, in the case where the second target value tends to be increased, and an indicating characteristic, which indicates a value equal to or less than the first target value from the indicated value of the pointer determined at the present time, in the case where the second target value tends to be decreased, and acting the pointer by means of an indicated value in the unit of an output updating cycle in accordance with the indicating characteristic.

* * * * *